United States Patent [19] [11] Patent Number: 5,864,498
Womack [45] Date of Patent: Jan. 26, 1999

[54] FERROMAGNETIC MEMORY USING SOFT MAGNETIC MATERIAL AND HARD MAGNETIC MATERIAL

[75] Inventor: Richard Womack, Albuquerque, N. Mex.

[73] Assignee: High Density Circuits, Albuquerque, N. Mex.

[21] Appl. No.: 943,080

[22] Filed: Oct. 1, 1997

[51] Int. Cl.$^6$ .................................................. G11C 11/15
[52] U.S. Cl. ........................................ 365/173; 365/171
[58] Field of Search ................................ 365/173, 171, 365/130, 131

[56] References Cited

U.S. PATENT DOCUMENTS 3,918,032  11/1975  Nicolaides ................................ 257/3
5,459,687  10/1995  Sakakima et al. ...................... 365/158

Primary Examiner—David Nelms
Assistant Examiner—Andrew Q. Tran
Attorney, Agent, or Firm—Calvin B. Ward

[57] ABSTRACT

A magnetic memory cell for storing binary encoded data and a memory constructed from these memory cells. A memory cell according to the present invention stores information in the direction of magnetization of a layer of magnetic material. The memory cell is constructed from a structure having a top electrode, a soft layer which includes a planar sheet of a soft magnetic material, a hard layer which includes a planar sheet of a hard magnetic material, and a bottom electrode, the soft and hard layers being sandwiched between the top and bottom electrodes. The hard and soft materials are chosen such that the magnitude to the magnetic field needed to magnetize the hard magnetic material is greater than the magnitude of the magnetic field needed to magnetize the soft magnetic material. The memory cell also includes a write circuit that generates first and second magnetic fields. The first and second magnetic fields are parallel to the planar sheet of the soft layer. The magnitudes of the first and second magnetic fields are less than that needed to magnetize the soft magnetic material. However, the magnitude of the vector sum of the first and second magnetic fields is greater than the magnetic field needed to magnetize the soft magnetic material but less than the magnetic field needed to magnetize the hard magnetic material.

15 Claims, 8 Drawing Sheets

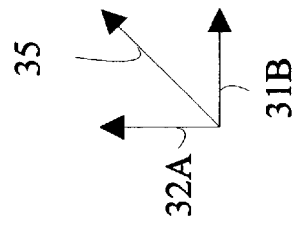
FIGURE 8
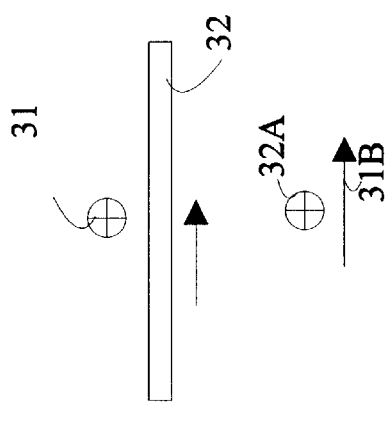
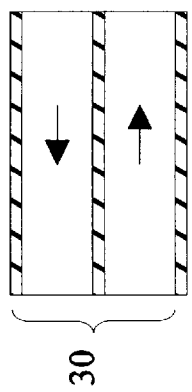
FIGURE 7
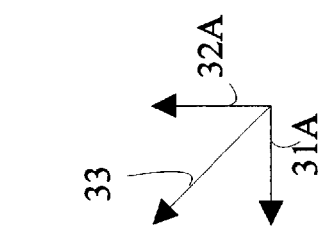
FIGURE 6
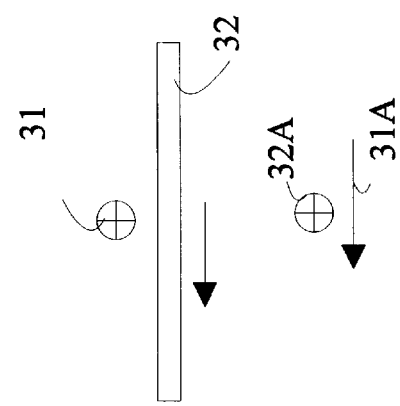
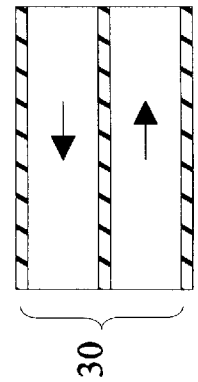
FIGURE 5

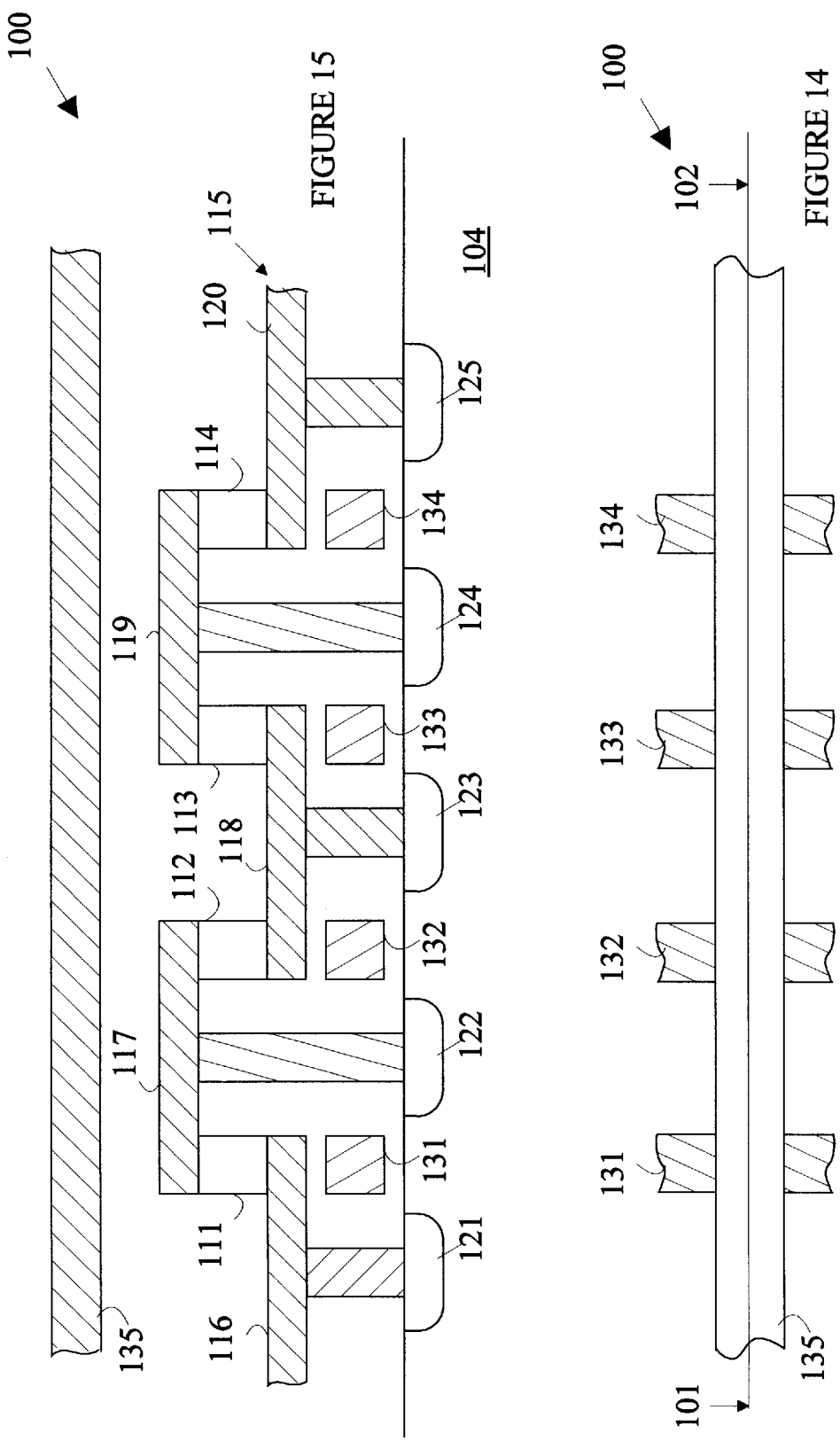

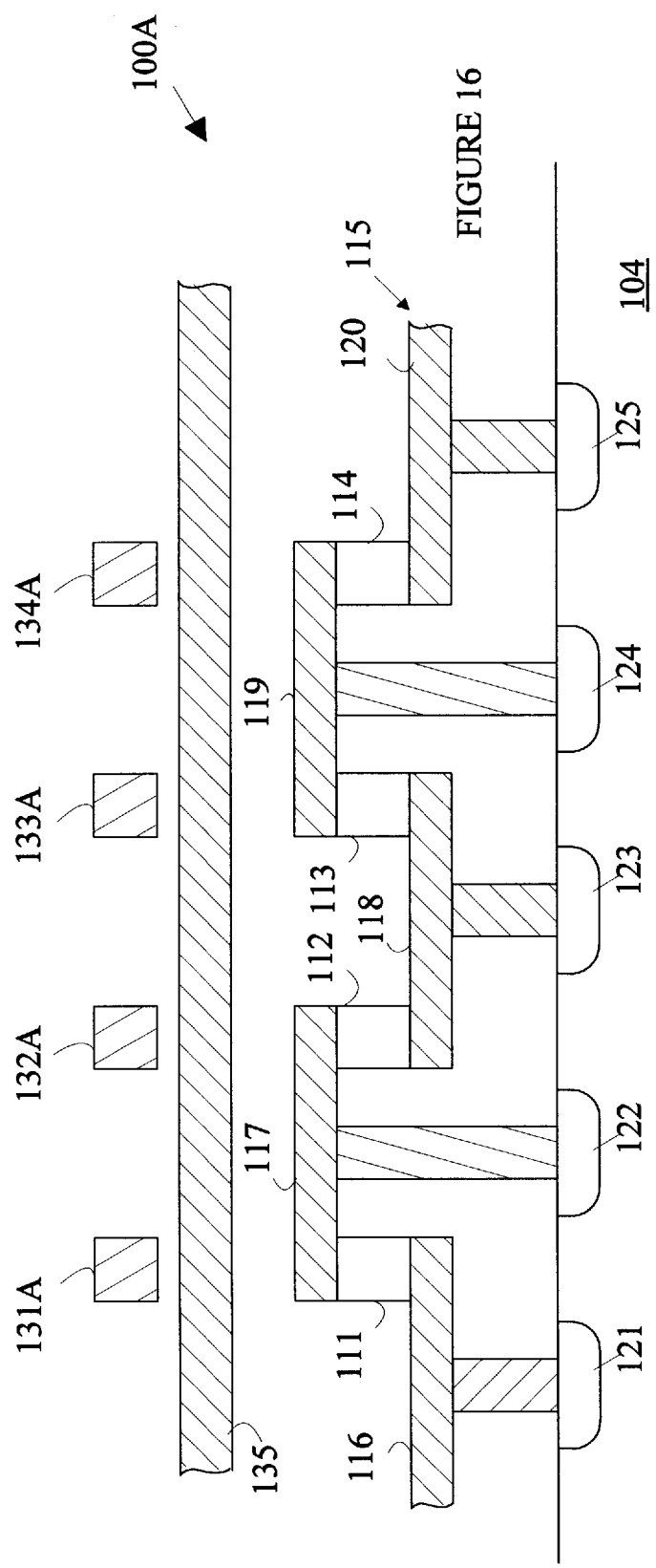

FERROMAGNETIC MEMORY USING SOFT MAGNETIC MATERIAL AND HARD MAGNETIC MATERIAL

FIELD OF THE INVENTION

The present invention relates to memory systems for use with computers and the like, and more particularly, to a memory based on ferromagnetic memory cells.

BACKGROUND OF THE INVENTION

Memory cells based on ferromagnetic structures are known to the art. These cells are constructed from a three layered structure in which two ferromagnetic layers are separated by a conducting non-magnetic layer. The ferromagnetic layers have different degrees of "hardness". For the purposes of this discussion, the "hardness" of a ferromagnetic layer will be defined to be the magnetic field needed to change the direction of magnetization of the material, a "hard" layer requiring a greater magnetic field than a "soft" layer. Data is stored in one of the layers by magnetizing the layer, a "1" corresponding to one direction of magnetization, a "0" to the other direction of magnetization. The other layer is used as a "reference" layer. For the purposes of this discussion, it will be assumed that data is stored in the soft layer, and the hard layer is used as the reference layer. In this case, the reference layer is permanently magnetized in one direction, and a field less than that needed to switch the reference layer is applied to store data in the soft layer.

The data is read by measuring the current that flows through the structure when a potential is applied across the two ferromagnetic layers. If the data layer is magnetized in the same direction as the reference layer, the device displays a smaller resistance to current flow than the case in which the two layers have different directions of magnetization.

While the basic cell has been known for some time, useful memories based on these cells have not been practical. Conventional memory architectures in which the memory cells are isolated or connected from a bit line by a transistor cannot be used with ferromagnetic memory cells because the resistance of the memory cells is small compared to the resistance of a transistor in the conducting state. Hence, the changes in resistance of the memory cell are masked by the high resistance of the isolation transistor.

To write a memory cell, a magnetic field must be applied to that memory cell that is sufficient to switch the soft layer, but less than the field that switches the reference layer. In addition, neighboring cells must not be switched. This requires a system for generating a local magnetic field at each memory cell. Memory architectures used in conventional CMOS memories or ferroelectric-based memories do not provide a means for generating local magnetic fields. In addition, conventional memory architectures require transistors in series with the memory elements to isolate the memory elements from the lines used to write the data therein. These transistors limit the currents, and hence, the magnetic fields, that may be applied to the memory elements in a magnetic memory cell.

Broadly, it is the object of the present invention to provide a memory system based on ferromagnetic memory cells.

It is a further object of the present invention to provide a memory system that does not require each cell to be isolated or connected by a pass transistor.

These and other objects of the present invention will become apparent to those skilled in the art from the following detailed description of the invention and the accompanying drawings.

SUMMARY OF THE INVENTION

The present invention is a magnetic memory cell for storing binary encoded data and a memory constructed from these memory cells. A memory cell according to the present invention stores information in the direction of magnetization of a layer of magnetic material. The memory cell is constructed from a structure having a top electrode, a soft layer which includes a planar sheet of a soft magnetic material, a hard layer which includes a planar sheet of a hard magnetic material, and a bottom electrode, the soft and hard layers being sandwiched between the top and bottom electrodes. The hard and soft materials are chosen such that the magnitude to the magnetic field needed to magnetize the hard magnetic material is greater than the magnitude of the magnetic field needed to magnetize the soft magnetic material. The memory cell also includes a write circuit that generates first and second magnetic fields. The first and second magnetic fields are parallel to the planar sheet of the soft layer. The magnitudes of the first and second magnetic fields are less than that needed to magnetize the soft magnetic material. However, the magnitude of the vector sum of the first and second magnetic fields is greater than the magnetic field needed to magnetize the soft magnetic material but less than the magnetic field needed to magnetize the hard magnetic material.

The memory cells may be connected in a rectangular array having a plurality of rows and columns to provide a memory system. The memory cells in any given column are connected in series by connecting the top electrode of each memory cell to the bottom electrode of an adjacent memory cell at a node between the memory cells. The memory system also includes a plurality of switching circuits for connecting a node in any given column to a node in an adjacent column for the purpose of measuring the potential difference across each memory element.

BRIEF DESCRIPTION OF THE DRAWINGS

FIG. 5 is a cross-sectional view of a magnetic memory cell together with the conductors used to generate the magnetic fields used to write data into the memory cell.

FIG. 6 illustrates the magnetic fields generated by the two conductors shown in FIG. 5 for the current directions shown in FIG. 5.

FIG. 7 is a cross-sectional view of a magnetic memory cell together with the conductors used to generate the magnetic fields used to write data into the memory cell showing the current configuration used to write the alternate binary state.

FIG. 8 illustrates the magnetic fields generated by the two conductors shown in FIG. 7.

FIG. 14 is a top view of the portion of a memory connected to a read line and illustrating one possible placement of the write conductors.

FIG. 15 is a cross-sectional view of the memory shown in FIG. 14 taken through line 101–102.

FIG. 16 is a cross-sectional view of a portion of a memory according to the present invention showing an alternative placement of the write conductors.

DETAILED DESCRIPTION OF THE INVENTION

Figure 1:
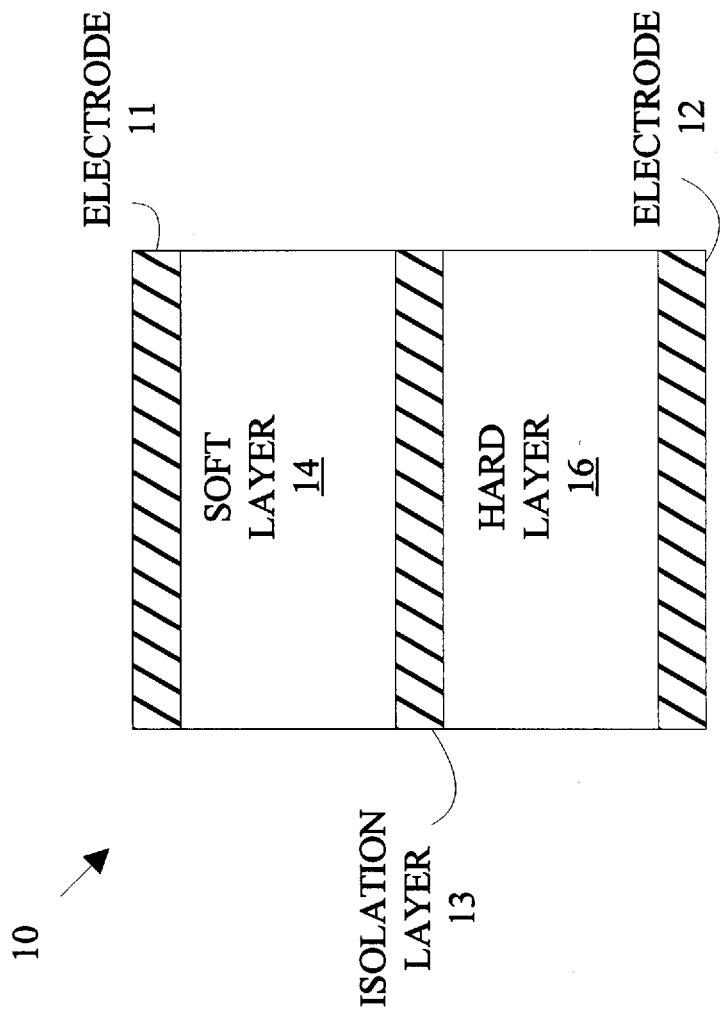
FIG. 1 is a cross-sectional view of a magnetic memory cell according to the present invention.

The present invention is based on a magnetic memory cell of the general type shown in FIG. 1 which is a cross-sectional view of a magnetic memory cell 10. Magnetic memory cell 10 is constructed from two layers of magnetic material which are sandwiched between a top electrode 11 and a bottom electrode 12. The two layers of magnetic material are isolated from one another by an isolation layer 13 which is constructed from a conducting material such as copper. The two magnetic layers have different degrees of hardness.

The magnetic materials used for the various layers are typically alloys. The degree of hardness of these alloys is determined by the materials in the alloy and their relative concentrations. For example, a NiFe alloy or a CoFe alloy may be used for the soft layer. The field needed to flip the magnetization of a CoFe alloy varies from 5 to 100 oe depending on the composition of the alloy. Hence, the hard layer may also be constructed from a CoFe alloy having different relative concentrations from that used for the soft layer.

The hard layer may be constructed from Cobalt or an alloy thereof, e.g. CoFe or NiCoFe. For example, NiCoFe alloys require fields between 50 and 200 oe to flip magnetization of the hard layer.

Figure 3:
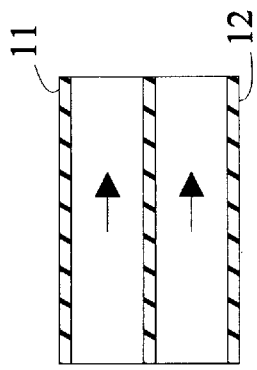
FIG. 3 is a cross-sectional view of a magnetic memory cell storing a binary "0".
Figure 2:
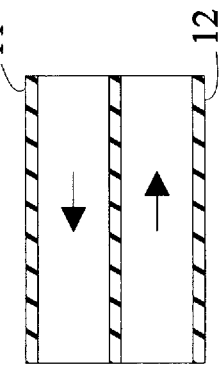
FIG. 2 is a cross-sectional view of a magnetic memory cell storing a binary "1".

In the following discussion, it will be assumed that data is stored in memory cell 10 by changing the direction of magnetization of the soft layer 14. The hard layer 16 remains magnetized in the same direction. If the soft layer is magnetized in the same direction as the hard layer as shown in FIG. 3, the electrical resistance measured between electrodes 11 and 12 will be less than the resistance measured when the soft layer is magnetized in the opposite direction as shown in FIG. 2.

Isolation layer 13 reduces the coupling between the hard and soft layers. Ideally, the magnetic field needed to flip the magnetization of the soft layer between the two possible storage states should be the same independent of the starting state. However, the two layers are strongly coupled when placed in contact with one another. Without isolation layer 13, the magnetic field needed to switch the memory cell from the configuration shown in FIG. 2 to that shown in FIG. 3 would be much greater than the magnetic field needed to switch the memory cell in the reverse sequence.

Figure 4:
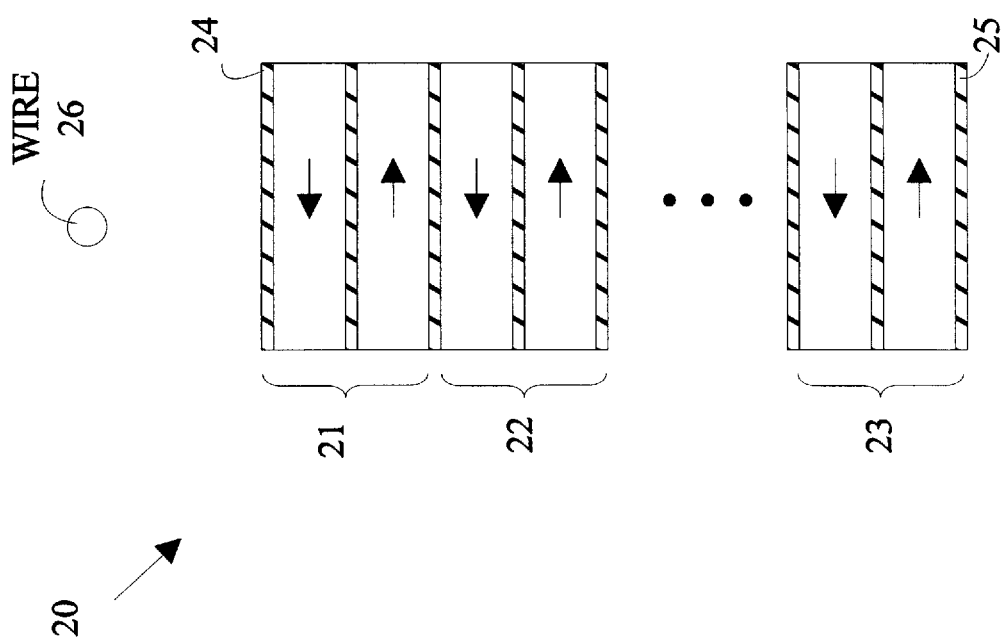
FIG. 4 is a cross-sectional view of a memory cell having a plurality of soft and hard layers.

The change in resistance between the two storage states is relatively small. Hence, it is advantageous to combine a number of basic magnetic cells in series. Such a multi-cell structure is shown in FIG. 4 at 20. Exemplary magnetic cells are shown at 21–23. The resistance is measured between electrodes 24 and 25.

The limit on the number of basic magnetic cells that can be combined is determined by the manner in which the magnetic field used to write data into storage cell 20 is generated. To write data, a magnetic field sufficient to switch the soft layers in all of the basic cells must be applied to storage cell 20. This field must also be less than the magnetic field that would switch any of the hard layers in the basic cells. As will be explained in more detail below, the magnetic field is generated by a current flowing in a conductor such as wire 26 whose axis runs into and out of the plane of the figure. The magnetic field generated by such a conductor decreases linearly with the distance from the conductor. Hence, basic storage cell 23 will be subjected to a smaller field than basic storage cell 21. If the current is set such that the magnetic field at basic storage cell 21 is just below the field that would switch the hard layer of cell 21, then the largest possible number of cells is that for which the magnetic field at cell 23 is just large enough to write the soft layer of that cell.

To implement a memory based on an array of storage cells, a scheme for addressing precisely one of a group of storage cells for writing is needed. The present invention utilizes one address scheme for writing a storage cell and a different address scheme for reading the storage cell. As noted above, data is written into a storage cell by exposing the storage cell to a magnetic field of sufficient strength to align the soft layers in a direction specified by the data to be stored. At the same time, the field generated on adjacent storage cells must be less than needed to alter the direction of polarization of the soft layers.

The present invention generates the magnetic field used for writing by combining two magnetic fields that are at right angles with respect to one another to generate a magnetic field of sufficient strength to set the magnetization of the soft layers. Each of separate magnetic fields are insufficient in strength to alter the magnetization of the soft layers.

Refer now to FIG. 5 which is a cross-sectional view of a magnetic memory cell 30 together with the conductors used to generate the magnetic fields used to write data into memory cell 30. The two conductors used write memory cell 30 are shown at 31 and 32, respectively. Conductor 31 runs perpendicular to the plane of the figure; while conductor 32 runs parallel to the plane of the figure and at right angles to conductor 31. For the purposes of this discussion, the direction of the current flowing in conductor 31 is into the plane of the figure. The magnetic fields generated by the two conductors as seen from a point on top of memory cell 30 are shown in FIG. 6. The magnetic field generated by conductor 31 is shown at 31A and the magnetic field generated by conductor 32 is shown at 32A. The magnetic field resulting from the sum of magnetic fields 31A and 32A is shown at 33.

The direction of current flow in conductor 32 determines the data that is written into memory cell 30. If the current direction shown in FIG. 5 is defined to be a "1", then a "0" is written by utilizing the opposite direction of current flow as shown in FIGS. 7 and 8. FIG. 7 is a cross-sectional view of a magnetic memory cell 30 together with the conductors used to generate the magnetic fields used to write data into memory cell 30. The magnetic fields generated when the direction of the current in conductor 32 is reversed are shown in FIG. 8. The net magnetic field applied to magnetic cell 30 is now as shown at 35 in FIG. 8.

Figure 10:
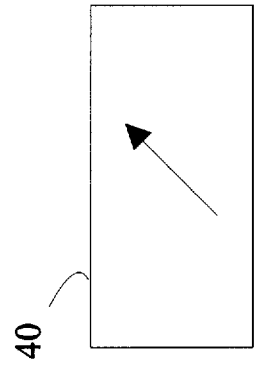
FIGS. 9 and 10 illustrate the magnetization directions generated for the two binary states in the absence of anisotropy.
Figure 9:
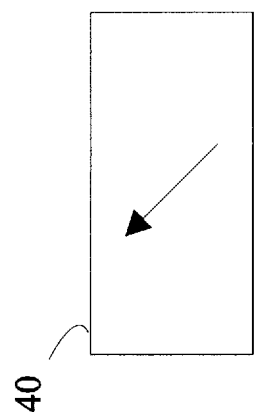

Magnetic memory cell 30 is constructed from rectangular layers of magnetic materials as shown in FIGS. 9 and 10 which are top views of a memory cell 40. In the absence of some form of induced anisotropy, the direction of magnetization of the two layers would be as shown in these two figures by the arrows within the memory cells. FIG. 9 corresponds to one data state, and FIG. 10 corresponds to the opposite data state. While these magnetization patterns will give rise to a difference in resistance between the two states, they are less than optimal.

Figure 12:
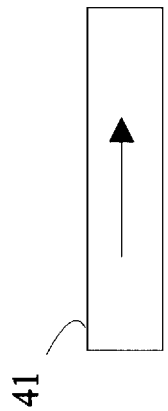
FIGS. 11 and 12 illustrate the magnetization directions generated for the two binary states in the presence of anisotropy.
Figure 11:
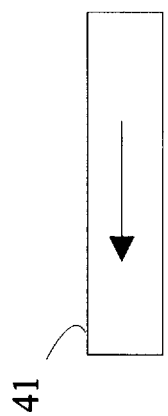

In the preferred embodiment of the present invention the layers are constructed so as to have an anisotropy which restricts the magnetization directions to two distinct and opposite directions. In the case of rectangular layers, the anisotropy can be introduced by adjusting the width to length ratio of the rectangles. When the ratio is sufficiently small, the magnetization direction is essentially parallel to the long dimension of the rectangle. In this case, the two magnetization states will be as shown in FIGS. 11 and 12. FIGS. 11 and 12 are top views of a memory cell 41 having spatially induced anisotropy illustrating, respectively, the directions of magnetization in the soft layers for the two different data states.

Figure 13:
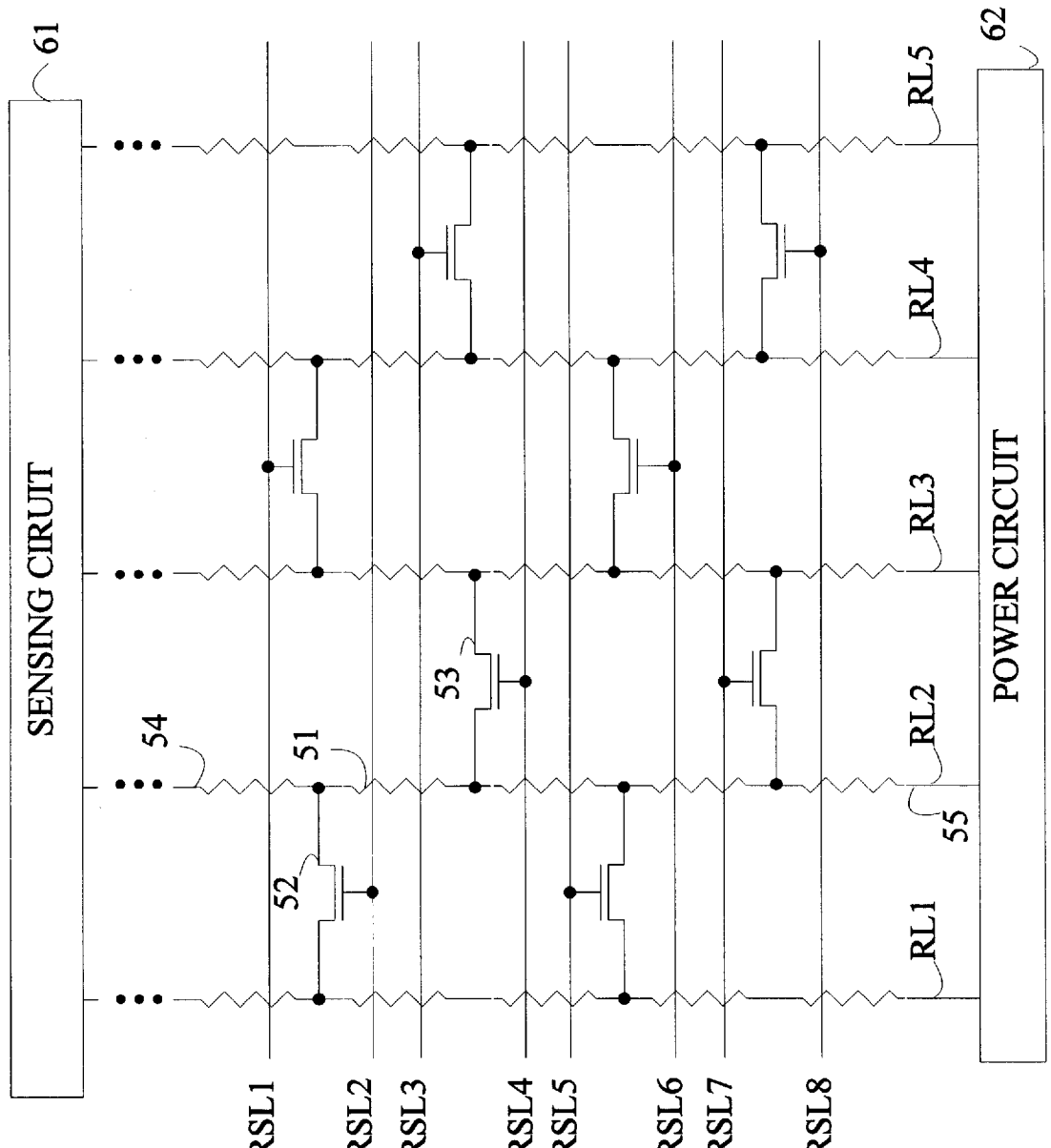
FIG. 13 is a schematic diagram of a portion of a memory according to the present invention as seen from the point of view of the read circuitry.

Refer now to FIG. 13 which is a schematic diagram of a portion of a memory 50 according to the present invention as seen from the point of view of the read circuitry. The memory elements are organized into a rectangular array of elements. Each of the memory elements appears to be a small resistor. An exemplary memory element is shown at 51. All of the elements in any given column are connected in series to form a read line having a node between each of the memory elements. For example, memory element 51 is connected to RL 2.

It should be noted that the memory elements are symmetrical. That is, there is no distinction between the "top" and "bottom" electrodes. For notational convenience, the series connections will be described as if the top electrode of each memory element within a column is connected to the bottom electrode of the memory element closest to sensing circuit 61. The top electrode of the memory elements closest to sensing circuit 61 are connected to the sensing circuit. Similarly, the bottom electrode of each memory element within a column is connected to the top electrode of the adjacent memory element in the column that is closest to power circuit 62.

Each memory element may also be connected to the read lines on each side of its column with the aid of two transistors. For example, memory element 51 may be connected to RL1 and RL3 by placing signals of read select lines RS2 and RS4, respectively. The signal on RS2 places transistor 52 in a conducting state, and the signal on RS4 places transistor 53 in a conducting state.

As noted above, the resistances that must be sensed are quite small. Hence, a large current must be used to generate a significant voltage difference across the memory element. Sensing schemes in which the current must pass through an isolation transistor in series with the memory element are, hence, to be avoided, since the conductance of the transistor in the conducting state is still much greater than that of the resistance being sensed. The present invention avoids such arrangements.

The manner in which the data is sensed will now be explained with reference to memory element 51. To measure the resistance of memory element 51, transistors 52 and 53 are placed in a conducting state and RL1 and RL3 are connected to a very high impedance voltage sensing circuit. At the same time, a large current is passed through RL2 by connecting the ends shown at 54 and 55 to the appropriate voltage sources. Since RL1 and RL3 are essentially floating, the difference in voltage measured between RL1 and RL3 is the difference in voltage measured across memory element 51. Since no significant current flows through the transistors during the measurement process, the resistance of the transistors does not introduce problems in sensing the small resistances of the memory elements.

Accordingly, one end of each of the read lines terminates in a sensing circuit 61 which either connects that end to a voltage sensing circuit or to a power rail. The voltage sensing circuit measures the potential difference between that line and a second read line. The other end of each read line is connected to a power circuit which either connects that line to a second power rail or allows the line to float.

The manner in which the read and write circuitry are combined to provide a memory according to the present invention may be more easily understood with reference to FIGS. 14 and 15. FIG. 14 is a top view of the portion of a memory 100 that is connected to a read line 115. FIG. 15 is a cross-sectional view of memory 100 taken through line 101–102 shown in FIG. 14. The portion of memory 100 shown in these figures includes 4 memory elements shown at 111–114. These elements are connected in series at nodes 116–120 along read line 115. Each node is connected to a transistor which is used to make connections to that node during read operations. The drain/source of the transistors connected to nodes 116–120 are shown at 121–125, respectively.

Data is written into memory elements 111–114 by combining the magnetic fields generated by passing a current through write line 135 and a corresponding one of write lines 131–134 which run at right angles to write line 135. For example, data is written into memory element 111 by passing currents through write line 135 and orthogonal write line 131. The direction of the current in either line may be used to set the data value. The choice of which line carries the data will, in general, depend on the memory architecture.

The arrangement of write conductors shown in FIGS. 14 and 15 is preferred because the two write conductors that operate to set the data in any given memory element are approximately equi-distant from the memory element. However, other arrangements can be utilized. Refer to FIG. 16 which is a cross-sectional view of a portion of memory 100A. Memory 100A is essentially the same as memory 100 with the exception of the orthogonal write conductors which have been moved to a location above write conductor 135 as shown at 131A–134A. Since write conductors 131A–135A are now further from the corresponding memory elements, the current needed to generate the same magnetic field in the memory elements is somewhat larger than that required in memory 100.

As discussed above, the differential resistance between the two directions of magnetization obtained with an individual three layer memory element as shown in FIG. 1 is relatively small. Accordingly, each memory element is preferably constructed by stacking as many of these three layer structures as possible. However, there is a limit to the number of such three-layered structures that can be placed in any single vertical stack.

Figure 17:
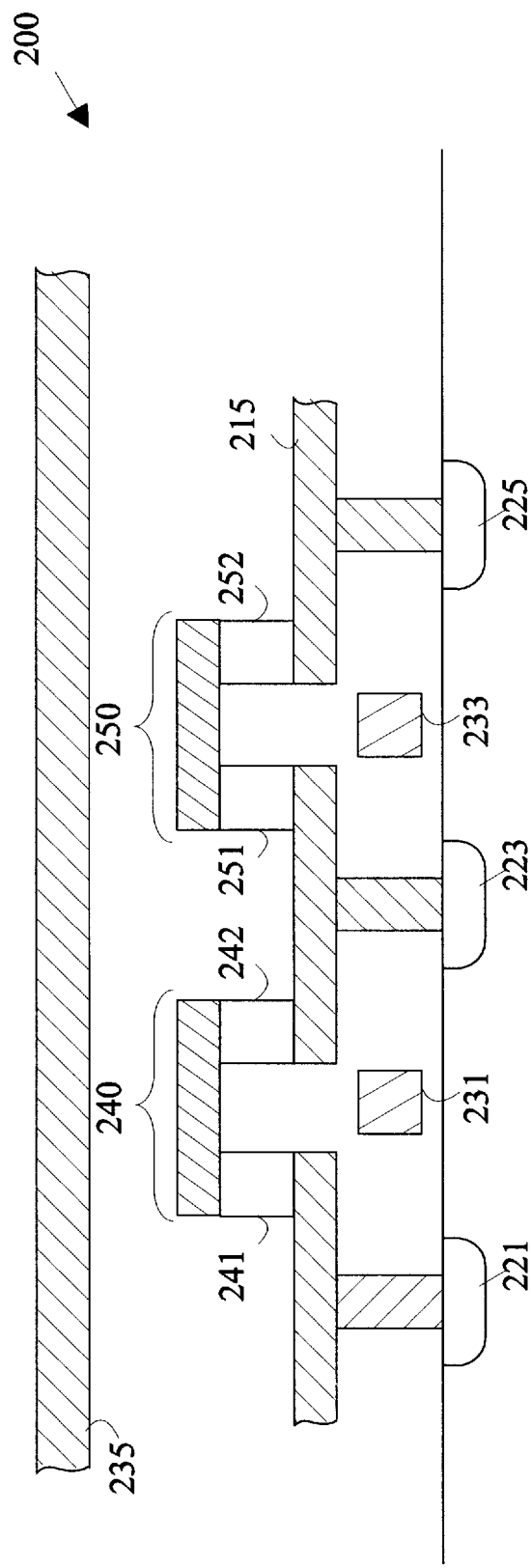
FIG. 17 is a cross-sectional view of a portion of a memory according to the present invention illustrating the manner in which to memory elements may be combined to provide a single bit memory cell having an increased difference in resistance between the two binary states.

One method for increasing the effective number of layers in a stack is to utilize two stacks that are connected in series. Such an arrangement is shown in FIG. 17 which is a cross-sectional view of a portion of a memory 200 along one read line 215. The portion shown in the figure has two one-bit cells shown at 240 and 250. Each one-bit cell is constructed from two memory elements which are connected in series. Memory cell 240 is constructed from memory elements 241 and 242, and memory cell 250 is constructed from memory elements 251 and 252.

Data is written into memory cell 240 by passing the appropriate currents through write line 235 and orthogonal write line 231. Write line 231 is located such that the distance to each of the memory elements 241 and 242 is substantially the same. Similarly, data is written into memory cell 250 by passing the appropriate currents through write line 235 and orthogonal write line 233. This arrangement effectively doubles the number of three layer structures that can be combined to provide a one bit memory cell.

The above described embodiments of the present invention have assumed that the data is written into the soft layer(s) of the memory cell. Embodiments in which the data is stored in the hard layer may also be constructed. In such systems, the write field must be strong enough to flip the magnetization of the hard layer(s). This field will also flip the magnetization of the soft layers. Hence, after writing, the hard and soft layers will have the same direction of magnetization. The memory cell is read by changing the direction of magnetization of the soft layer between the two possible directions for that layer and comparing the corresponding resistances of the memory cell. The direction of magnetization of the soft layer(s) is set by passing currents through the same write conductors used to write the hard layer(s). However, the magnitude of the currents is reduced to assure that only the direction of magnetization of the soft layer(s) is altered. It should be noted that the memory configurations described above may also be used with embodiments in which the data is stored in the hard layer(s).

Various modifications to the present invention will become apparent to those skilled in the art from the foregoing description and accompanying drawings. Accordingly, the present invention is to be limited solely by the scope of the following claims.

What is claimed is:

1. A memory cell for storing information in the direction of magnetization of a layer of magnetic material, said memory cell comprising a memory element and a write circuit, said memory element comprising:
   a top electrode;
   a soft layer comprising a planar sheet of a soft magnetic material;
   a hard layer comprising a planar sheet of a hard magnetic material, the magnitude of the magnetic field needed to magnetize said hard magnetic material being greater than the magnitude of the magnetic field needed to magnetize said soft magnetic material; and
   a bottom electrode, said soft and hard layers being sandwiched between said top and bottom electrodes; and
   said write circuit generates first and second magnetic fields, said first and second magnetic fields being parallel to said planar sheet of a data storage layer, said data storage layer comprising either said hard layer or said soft layer, the magnitude of said first and second magnetic fields being less than that needed to magnetize said data storage layer magnetic material and the magnitude of the vector sum of said first and second magnetic fields being greater than the magnetic field needed to magnetize said data storage layer magnetic material.

2. The memory cell of claim 1 wherein said data storage layer comprises said soft layer and wherein the magnitude of the vector sum of said first and second magnetic fields is less than that needed to magnetize said hard magnetic material.

3. The memory cell of claim 1 wherein said write circuit comprises first and second conductors, said first and second conductors being parallel to said planar sheet of said data storage layer, said first conductor generating said first magnetic field when a current is passed therethrough and said second conductor generating said second magnetic field when a current is passed therethrough.

4. The memory cell of claim 3 wherein said first conductor is perpendicular to said second conductor.

5. The memory cell of claim 3 wherein said memory element lies between said first and second conductors.

6. The memory cell of claim 3 wherein said first and second conductors are on the same side of said top electrode.

7. The memory cell of claim 1 further comprising a second memory element, said second memory element comprising:
   a top electrode;
   a soft layer comprising a planar sheet of a soft magnetic material;
   a hard layer comprising a planar sheet of a hard magnetic material, the magnitude of the magnetic field needed to magnetize said hard magnetic material being greater than the magnitude of the magnetic field needed to magnetize said soft magnetic material, one of said hard or soft layers comprising a data storage layer; and
   a bottom electrode, said soft and hard layers being sandwiched between said top and bottom electrodes, said second memory element being positioned such that the magnitude of said first and second magnetic fields are less than that needed to magnetize said data storage layer magnetic material and the magnitude of the vector sum of said first and second magnetic fields being greater than the magnetic field needed to magnetize said data storage layer magnetic material.

8. The memory cell of claim 7 wherein said write circuit generates substantially the same magnetic fields in said data storage layer of said first memory element and said data storage layer of said second memory element.

9. A memory system comprising a plurality of one bit memory cells, each of said one bit memory cells comprising:
   a top electrode;
   a soft layer comprising a planar sheet of a soft magnetic material;
   a hard layer comprising a planar sheet of a hard magnetic material, the magnitude of the magnetic field needed to magnetize said hard magnetic material being greater than the magnitude of the magnetic field needed to magnetize said soft magnetic material; and
   a bottom electrode, said soft and hard layers being sandwiched between said top and bottom electrodes,
   wherein, said one bit memory cells are arranged in a rectangular array having a plurality of rows and columns, and wherein said one bit memory cells in any given column are arranged in a linear order having a first memory cell, a last memory cell and one or more intermediate memory cells,
   said memory system further comprises a plurality of nodes, there being one such node between each two intermediate memory cells in each of said columns, said top and bottom electrodes of each of said intermediate memory cells being connected to said nodes, said top electrode of any given intermediate memory cell being connected to a different one of said nodes than said bottom electrode of that memory cell, thereby forming a series connected circuit of said intermediate memory cells; and a plurality of switching circuits for selectively connecting each of said nodes in each column to a node in a different column, there being one such switching circuit connected to each of said nodes.

10. The memory system of claim 9 further comprising a sensing circuit, connected to said top electrodes of said first memory cells in each of said columns, for measuring the potential difference between said top electrodes of said first memory cells.

11. The memory system of claim 9 further comprising a power circuit for causing a current to flow through said memory cells in a selected one of said columns.

12. The memory system of claim 9 further comprising:

a plurality of row write conductors, there being one such row write conductor corresponding to each of said rows in said memory system, each of said row write conductors being positioned with respect to said one bit memory cells in said corresponding row such that a current flowing through said row write conductor generates a first magnetic field in each of said one bit memory cells in said corresponding row; and a plurality of column write conductors, there being one such column write conductor corresponding to each of said columns in said memory system, each of said column write conductors being positioned with respect to said one bit memory cells in said corresponding column such that a current flowing through said column write conductor generates a second magnetic field in each of said one bit memory cells in said corresponding column, said first and second magnetic fields being parallel to said planar sheet of said soft layer in said one bit memory cells, the magnitude of said first and second magnetic fields being less than that needed to magnetize said soft magnetic material and the magnitude of the vector sum of said first and second magnetic fields being greater than the magnetic field needed to magnetize said soft magnetic material but less than the magnetic field needed to magnetize said hard magnetic material.

13. The memory system of claim 12 wherein said row conductors are perpendicular to said column conductors.

14. The memory system of claim 12 wherein said one bit memory cells lie between said row and column conductors.

15. The memory system of claim 12 wherein said row and column conductors are on the same side of said top electrodes of said one bit memory cells.

* * * * *